United States Patent [19]
Osafune et al.

[11] Patent Number: 6,046,876
[45] Date of Patent: Apr. 4, 2000

[54] HEAD SIGNAL DEVICE WITH NOISE IMMUNITY FUNCTION, FOR USE IN A DISK STORAGE APPARATUS

[75] Inventors: Koji Osafune; Tomihisa Ogawa, both of Tokyo, Japan

[73] Assignee: Kabushiki Kaisha Toshiba, Kawasaki, Japan

[21] Appl. No.: 09/056,040

[22] Filed: Mar. 31, 1998

[30] Foreign Application Priority Data

Jun. 30, 1997 [JP] Japan ................................. 9-174194

[51] Int. Cl.[7] ................................ G11B 5/02; G11B 5/09; G11B 15/12
[52] U.S. Cl. .................... 360/67; 360/46; 360/63
[58] Field of Search ..................... 360/46, 67, 63

[56] References Cited

FOREIGN PATENT DOCUMENTS 4-209304   7/1992   Japan ................. G11B 5/09

*Primary Examiner*—W. Chris Kim
*Attorney, Agent, or Firm*—Limbach & Limbach L.L.P.

[57] ABSTRACT

On an FCP board and in a head amplifier circuit, provided for amplifying a read signal from a head and supplying the read signal to a read channel, a dummy wiring pattern is located near a wiring pattern for supplying the read signal. The head amplifier circuit incorporates a differential amplifier. The differential amplifier finds and amplifies a difference between the read signal supplied through the wiring pattern and the noise signal supplied through the dummy wiring pattern. The differential amplifier outputs to a read channel the read signal from which the noise has been removed.

15 Claims, 6 Drawing Sheets

HEAD SIGNAL DEVICE WITH NOISE IMMUNITY FUNCTION, FOR USE IN A DISK STORAGE APPARATUS

BACKGROUND OF THE INVENTION

This invention relates to a device which is designed for use in a disk storage apparatus (e.g., a hard disk drive) having an MR head (including a GMR head) used as a read head, and which effectively removes noise from a read signal in the head amplifier circuit provided for amplifying signals read by the read head from a disk.

In a hard disk drive (HDD), the magnetic head reads data from, and writes data on, the recording surface of a disk. The disk is a magnetic recording medium which is rotated at high speed by a spindle motor. The head outputs the data read from the disk after converting the data into read signals which are electrical signals. A head amplifier circuit amplifies the read signals. The read signals thus amplified are transferred to a signal processing circuit generally known as "read channel." The read channel performs data processing such as converting the read signals to digital data. That is, the read channel reproduces the data from the disk.

As shown in FIG. 7, an HDD has a spindle motor 110, at least one disk 111 connected to the spindle motor 110, a head 112, a suspension 113 holding the head 112, an FPC (Flexible Printed Circuit) board 700, and a head amplifier circuit 600 and other circuit components, all mounted on the FPC board 700.

The head 112 is a read/write composite head comprising a read head for reading (data and a write head for writing data. The head 112 floats above the disk 111 due to the air stream generated while the spindle motor 110 rotates the disk 111 at high speed. While floating, the head 112 is moved in the radial direction of the disk 111 by a carriage 115 which is driven by a voice coil motor (VCM) 114. The carriage 115 is the main component of a head actuator and holds the suspension 113, which turn supports the head 112. A CPU (not shown), i.e., the main component of the HDD, controls the current which flows in the VCM 114 and the direction in which the current flows in the VCM 114. The head 112 is thereby moved to a target position on the disk 111 (i.e., a track to be accessed). At the target position the head 112 reads data from, or writes data on, the disk 111.

The read head of the head 112 is an MR head having an MR (Magnetoresistive) element or a GMR (Giant Magnetoresistive) element. Here it is assumed that the head 112 is a read head which is an MR head. As shown in FIG. 8, the head 112 has two output terminals 210a and 210b. The second output terminal 210b is connected to the ground.

The head amplifier circuit 600 amplifies a signal read by the head 112, hereinafter called "read signal." The head amplifier circuit 600 is an IC circuit known as "head IC." As shown in FIG. 8, the circuit 600 outputs the read signal to a read channel 800. The FPC board 700 is provided in a disk enclosure (DE) 118. The read channel, the CPU, a disk controller (HDC), and the like are mounted on a main CPB (Printed Circuit Board) 119. The main CPB 119 is located outside the DE 118 and connected to the FPC board 700 by a connector.

The top of the DE 118 is covered with a top cover 120. The top cover 120 is fastened by screws and thereby set in a fixed position. The DE 118 is therefore a sealed structure which allows no entry of dust.

The head 112 and the head amplifier circuit 600 are connected to each other by head lead (head wire) 122 and by wiring patterns formed on the FPC board 700 (see FIG. 8). One end of the FPC board 700 is fastened to the fixed part 116a of the carriage 115. In other words, the FPC-fastening part 116a connects the head 112 to the carriage 115. The other end of the FPC board 116 is fastened to the fixed part 116b of the base of the DE 118. The head amplifier circuit 600 is mounted on the fixed part 116b. The head amplifier circuit 600 can be mounted on the carriage 115 if the HDD is a 3.5-inch HDD. If the HDD is a smaller one, e.g., a 2.5-inch HDD, however, the circuit 600 cannot be mounted on the carriage 115. This is why the head amplifier circuit 600 is provided, usually on the fixed part 116b of the base of the DE 118.

The part of the FPC board 116 which exists between the fixed parts 116a and 116b is a movable part 116c. The movable part 116c is relatively long, several centimeters long. The wiring pattern (signal line) provided on the FPC board 700 is therefore several centimeters long. The wiring pattern connects the head 112 fastened by the carriage-side fixed part 116a and the head amplifier circuit 600 mounted on the base-side fixed part 116b.

Being so long, the wiring pattern absorbs the noise (external noise) generate(d from the electromagnetic waves and the like emanating from the devices located outside the HDD. The noise is probably superposed on the read signal supplied from the head 112 and is probably input to the head amplifier circuit 600.

The connection between the head 112 (MR head) and the head amplifier circuit 600, both incorporated in the HDD shown in FIG. 7, will be described with reference to FIG. 8.

Of the two output terminals of the head 112, the terminal 210a is connected to the input of the amplifier 601 (A1) provided in the head amplifier circuit 600, by the wiring pattern (conductor pattern) 211a formed on the FPC board 700. The other output terminal 210b of the head 112 is connected to the ground in the head amplifier circuit 600, by the wiring pattern (conductor pattern) 211b formed on the FPC board 700. Thus, the amplifier 601 (A1) provided in the circuit 600 is a single-end type amplifier.

The head amplifier circuit 600 incorporates a two-input differential amplifier 602 (A2). One input terminal of the differential amplifier 602 is connected to the output terminal of the amplifier 601 (A1). The other input terminal of the differential amplifier 602 is connected to the ground. The differential amplifier 602 converts the read signal amplified by the single-end type amplifier 601 to a differential signal, which is output to the read channel 800 mounted on the main PCB 119.

On the FPC board 700 connecting the head 112 and the head amplifier circuit 600, the noise (external noise) generated from the electromagnetic waves emanating from the devices located outside the HDD may be superposed from the patterns 211a and 211b onto the read signal. If so, the read signal containing the noise will be amplified and degraded in terms of quality. Such a low-quality read signal probably causes a read error in the hard disk controller (HDC) even if the read signal is subjected to noise-removing process in the read channel 800.

The noise can be removed from the read signal to be input to the head amplifier circuit 600 by using the technique disclosed in, for example, Jpn. Pat. Appln. KOKAI Publication No. 4-209304. This technique is to use an auxiliary element, a second amplifier and a third amplifier. The auxiliary element is provided on the slider, i.e., head body, and does not read data unlike the head 112 (i.e., main element) which reads and writes data. The auxiliary element detects an external noise signal. The second amplifier amplifies the external noise signal and inverts the phase thereof. The third amplifier superposes the output signal of the second amplifier on the read signal amplified by the first amplifier, canceling out the external noise only.

This known technique requires the auxiliary element provided on the slider (i.e., the head body). Furthermore, signal lines must be used to connect the auxiliary element to the second amplifier. It is extremely difficult to provide signal lines between such a magnetic head and the second amplifier. It is difficult to do so, particularly in an HDD which has a plurality of heads positioned one above another. To provide signal lines of this kind would increase the manufacturing cost of the HDD.

The known technique described above can remove the external noise from the read signal only if the head 112 has detected the noise. As the inventors hereof have found, most of the external noise contained in the read signal input to the head amplifier circuit 600 has been detected by the writing patterns provided on the FPC board 700 and connecting the head 112 to the circuit 600. This is probably because the wiring patterns 211a and 211b are as long as several centimeters in the HDD shown in FIG. 8.

BRIEF SUMMARY OF THE INVENTION

The object of the present invention is to remove the external noise detected by wires connecting a head and a head amplifier circuit, from the read signal read by the head, thereby to inhibit read errors effectively.

To attain the object, a disk storage drive according to the invention, which has an MR head and a disk used as a storage medium, comprises: first amplifier means for amplifying a read signal read by the head from the disk; cable means connecting the head and the first amplifier means, for supplying the read signal from the head to the first amplifier means; dummy circuit means provided near the cable means, for detecting noise on the cable means and supplying the noise as a noise signal; second amplifier means connected to the dummy circuit means, for amplifying the noise signal supplied from the dummy circuit means; and noise canceling means for receiving the read signal from the first amplifier means and the noise signal from the second amplifier means, and removing from the read signal the noise corresponding to the noise signal.

The dummy circuit means (more precisely, a dummy wiring pattern) detects an external noise, if any, applied on the cable means (i.e., a wiring pattern) while the read signal is being supplied via the cable means. The second amplifier means amplifies the external noise. The noise canceling means comprises a differential amplifier. It finds a difference between the read signal from the first amplifier means and the noise signal from the second amplifier, thereby canceling out the noise signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the invention will be described, with reference to the accompanying drawings.

Figure 7:
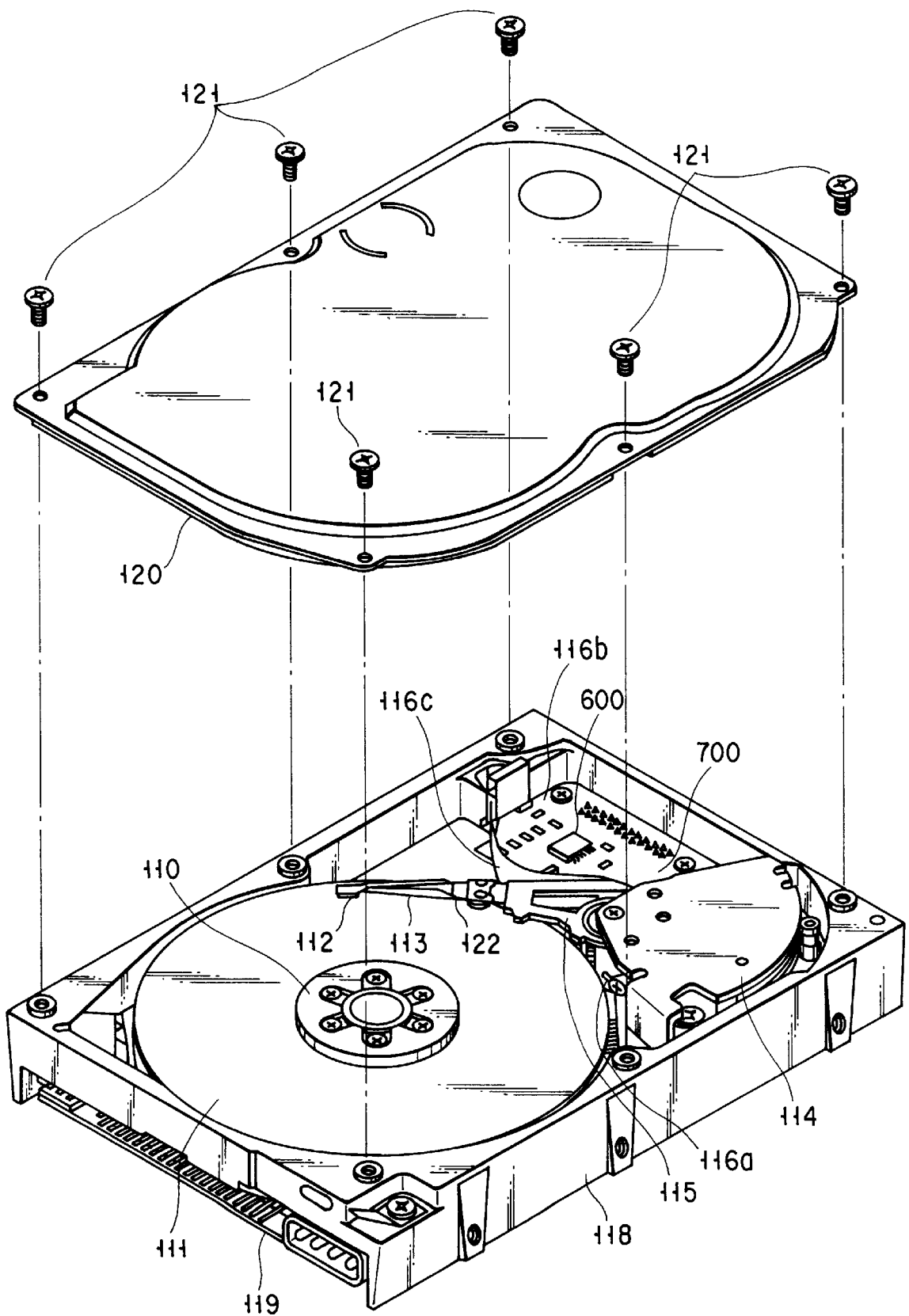
FIG. 7 is an exploded view of a conventional HDD.

The embodiments of the invention are 2.5-inch small HDDs of the type shown in FIG. 7, each having an MR head 112 used as the read head.

(FPC Board and Head Amplifier)

Figure 1:
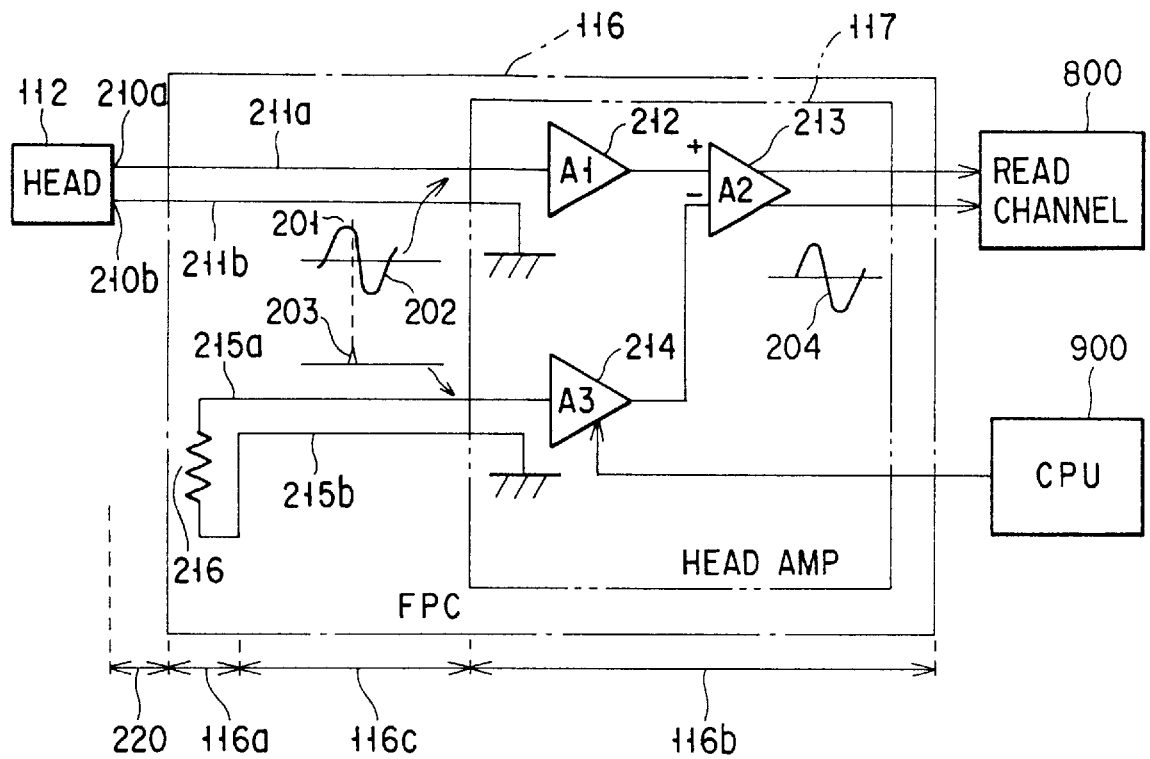
FIG. 1 is a block diagram showing the head amplifier circuit and the FPC board, both incorporated in an embodiment of the present invention.

FIG. 1 shows the FPC board 116 and head amplifier circuit 117 of an HDD which is the first embodiment of the invention and which has one head 112.

Figure 8:
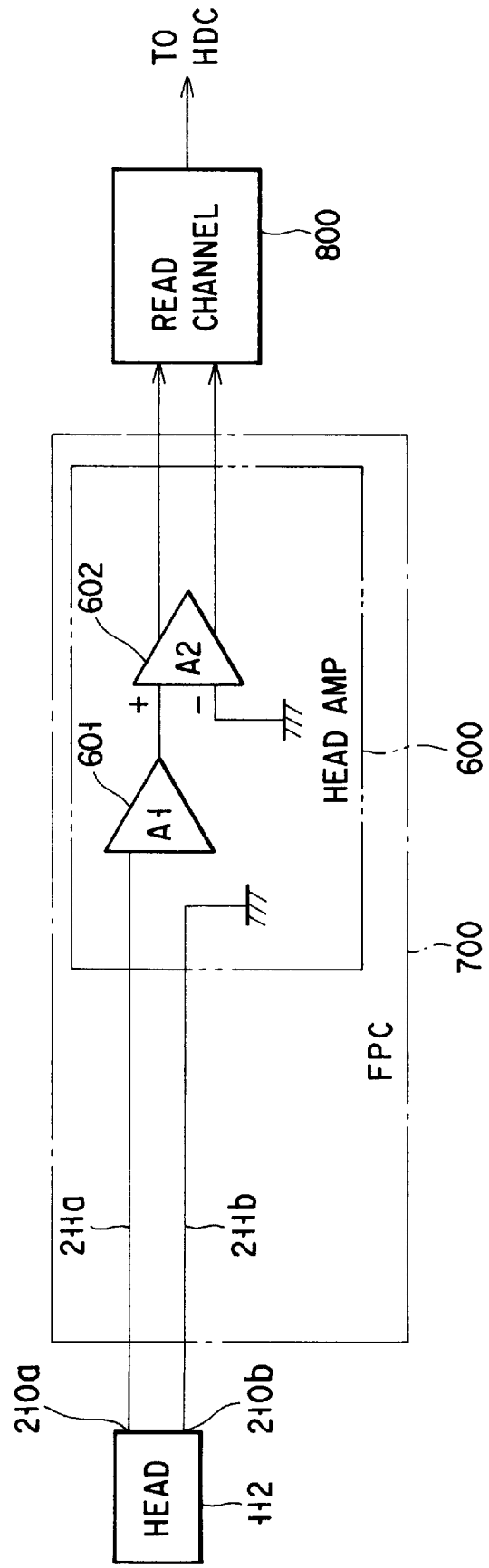
FIG. 8 is a block diagram representing the connection of the head and the head amplifier circuit, both incorporated in the conventional HDD.

As shown in FIG. 1, the head 112 has two output terminals 210a and 210b. Head leads 220, which is equivalent to the head leads 122 shown in FIG. 8, connect the output terminals 210a and 210b to one end of a wiring pattern 211a and one end of a wiring pattern 211b, respectively. Both wiring patterns 211a and 211b are arranged on the FPC board 116. (Said ends of the patterns 211a and 211b are (Equivalent to the carriage-side fixed part 116a shown in FIG. 7.) The wiring patterns 211a and 211b are connected at the other end to a single-end type head amplifier 212. The amplifier 212 is equivalent to the head amplifier 601 (A1) shown in FIG. 8. The head amplifier circuit 117 comprises a two-input differential amplifier 213 (A2) and a single-end type amplifier 214 (A3), in addition to the single-end type amplifier 2.12 (A1). The differential amplifier 213 is equivalent to the differential amplifier 602 (A2) illustrated in FIG. 8. The amplifier 214 (A3) is similar to the amplifier 212. It has a gain which can be varied in accordance with a signal supplied from a CPU 900 (mounted on a PCB 119 of the type shown in FIG. 7) through a serial interface or the like. The output of the amplifier 214 is connected to one input terminal (negative terminal) of the differential amplifier 213. The output of the amplifier 212 is connected to the other input terminal of the differential amplifier 213.

The other end of the wiring pattern 211a is connected to the amplifier 212 of the head amplifier circuit 117. The other end of the wiring pattern 211b is connected to the ground in the head amplifier circuit 117.

Arranged on the FPC board 116 are a pair of dummy wiring patterns 215a and 215b which have almost the same width and length as the wiring patterns 211a and 211b. The dummy wiring patterns 215a and 215b are located near the wiring patterns 211a and 211b and extend parallel thereto. The dummy wiring patterns 215a and 215b are connected at one end to a resistor pattern 216, which is provided near the head 112 (equivalent to the carriage-side fixed part 116a) and which may be replaced by a resistor element. The resistor pattern 216 and the (tummy wiring patterns 215a and 215b constitute the resistor element of the head 112, or a kind of a dummy head which cannot read data. The other end of the (dummy wiring pattern 215a is connected to the input terminal of the amplifier 214 (A3). The other end of the dummy wiring pattern 215b is connected to the ground in the head amplifier circuit 117.

The advantages of the present embodiment are described as follows.

In the HDD, the noise (external noise) generated from the electromagnetic waves and the like emanating from external devices may likely be detected at the movable part 116c. This is because the part 116c is comparatively long. More precisely, the external noise is detected by the wiring pattern 211a provided on the FPC board 116. Therefore, the noise is likely to be superposed on the read signal supplied from the head 112 and inevitably input to the amplifier 212 that is incorporated in the head amplifier circuit 117. The wiring pattern 211a is located between the carriage-side fixed part 116a and tie base-side fixed part 116b. In other words, the wiring pattern 211a is provided on the movable part 116c.

In the present embodiment, the dummy wiring patterns 215a and 215b are provided on the FPC board 116, positioned near the wiring patterns 211a and 211a and connected to the resistor pattern 216. The resistor pattern 216 is, so to speak, the resistor element of a dummy head. Hence, external noise 201 will very likely be superposed on the read signal 202 supplied from the head 112 as is illustrated in FIG. 1. If this happens, the dummy wiring pattern 215a will detect noise 203 which is similar to the noise 201 in terms of waveform.

The read signal 202 is input via the wiring pattern 211a to the single-end type amplifier 212 (A1), amplified thereby and supplied to cane (positive) input terminal of the differential amplifier 213 (A2). On the other hand, the signal on the dummy wiring pattern 215a (i.e., noise signal) is amplified by the single-end type amplifier 214 (A3), amplified thereby and supplied to the other (negative) input terminal of the differential amplifier 213 (A2). The differential amplifier 213 (A2) finds the difference between the read signal (containing noise) supplied from the wiring pattern 221a and the noise signal supplied from the dummy wiring pattern 215a. The differential amplifier 213 generates a signal representing this difference. This signal is supplied to a read channel 800.

As shown in FIG. 1, the external noise 201 is superposed on the read signal supplied generated by the head 112. The read signal containing the noise 201 is input to the amplifier 212 (A1). At this time, the voltage of the noise 203, which is applied on the dummy wiring pattern 215a, has a waveform (i.e., noise signal waveform) is similar to the waveform of the noise 201 superposed on the read signal 202. The noise signal 203 is amplified by the amplifier 214 (A3) and input to the differential amplifier 213 (A2), together with the output of the amplifier 212 (A1). The differential amplifier 213 (A2) cancels the noise 201 on the read signal 202 supplied from the head 112, with the noise 203 on the dummy wiring pattern 215a. Thus, the differential amplifier 213 outputs only the read signal having the waveform 204.

It is desirable that the gain of the amplifier 214 be set at the same value as the gain of the amplifier 212.

The dummy wiring patterns 215a and 215b, both provided on the FPC board 116, haves lengths different from those of the head pattern actually used. This is because the head leads 220 are used to connect the output terminals 210a and 210b to the writing patterns 211a and 211b, respectively, inevitably lengthening the head pattern actually used. The noise voltage applied on the dummy wiring patterns 215a and 215b differs from the noise voltage applied on the wiring patterns 211a and 211b which constitute a part of the head pattern. As a consequence, the noise can be canceled in part, but not completely.

Before the HDD is delivered from the factory, the gain of the amplifier 214 may be varied to several different values in accordance with instructions supplied from the CPU 900 via the serial interface or the like, and with the relationship between each of the different values and the read error rate. Of these different values, the most appropriate one that reduces the read error rate to a minimum may be selected ad set as the gain of the amplifier 214.

Preferably, the resistor pattern 216 has the same resistance as the head 112 (MR head). Nonetheless, the resistor pattern 216 may not be used at all. If this is the case, only the dummy wiring patterns 215a and 215b serve as resistor patterns.

(Modifications of the First Embodiments)

Figure 2:
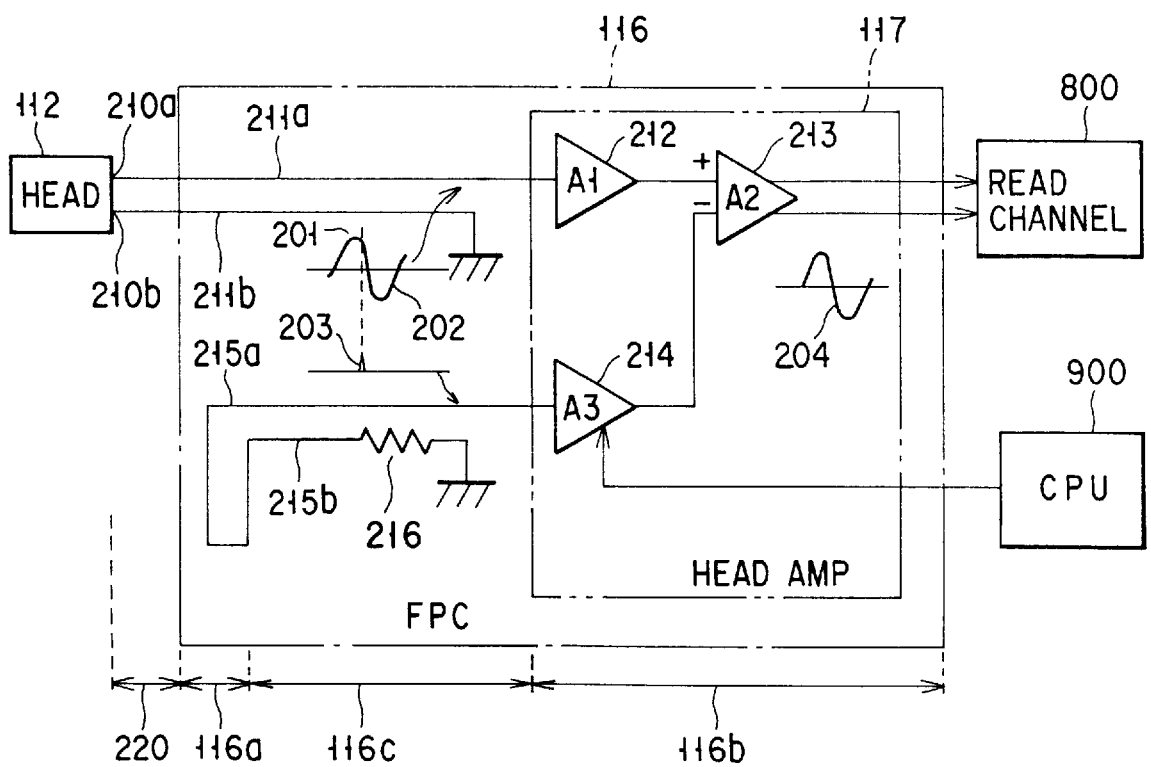
FIG. 2 is a block diagram illustrating a first modification of the embodiment shown in FIG. 1.

FIG. 2 illustrates a first modification of the embodiment shown in FIG. 1. As shown in FIG. 2, resistor patterns 216 connected to the dummy wiring patterns 215a and 215b are provided not on the FPC board 116 of the carriage side, but on the FPC board 116b of the base frame side. The first modification can achieve the same advantages as the first embodiment shown in FIG. 1.

Figure 3:
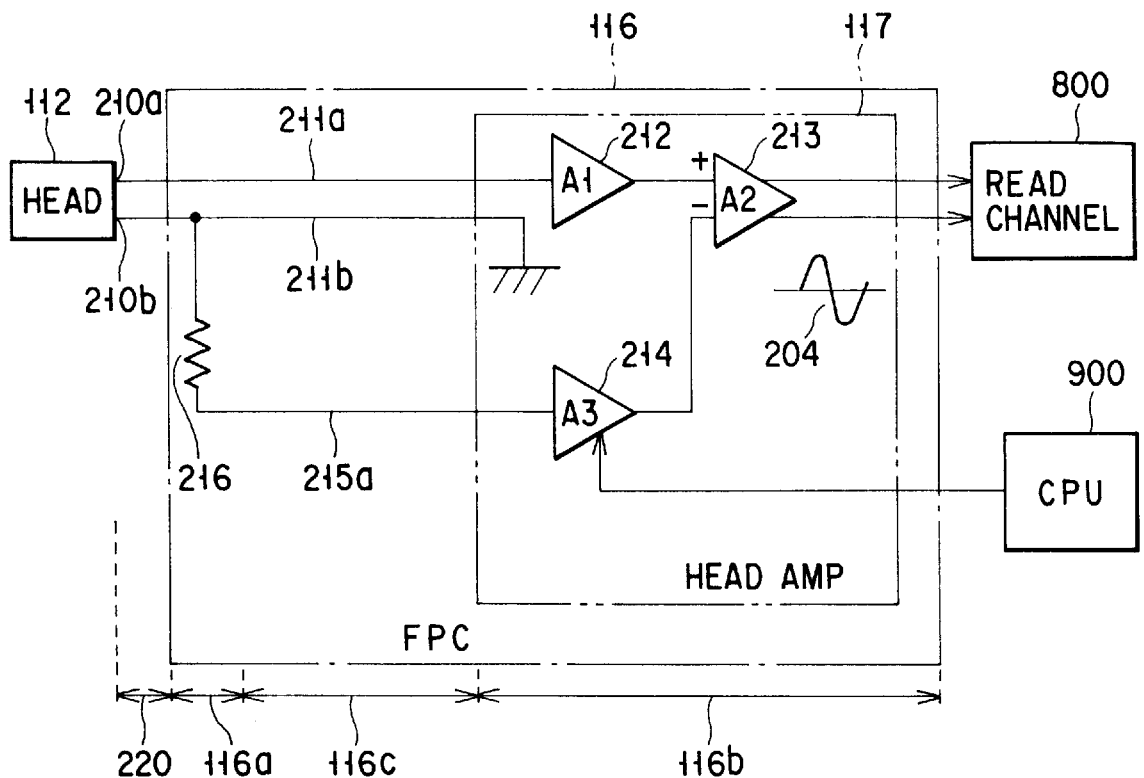
FIG. 3 is a block diagram depicting a second modification of the embodiment shown in FIG. 1.

FIG. 3 shows a second modification of the first embodiment. As shown in FIG. 3, one end of the dummy wiring pattern 215a of the resistor pattern 216 is connected not to the dummy wiring pattern 215b, but to the wiring pattern 211b. In other words, the wiring pattern 215b is used as the dummy wiring pattern 215b as well, and only the dummy pattern 215a and the resistor pattern 216 are used.

Figure 4:
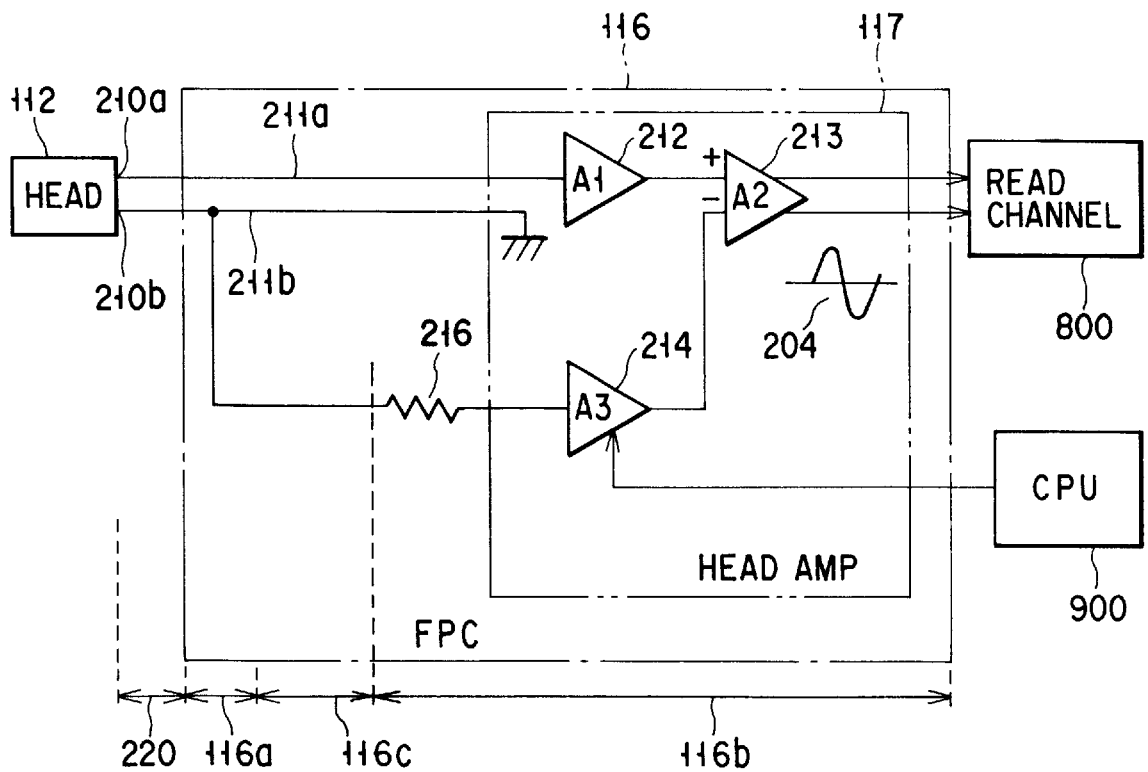
FIG. 4 is a block diagram illustrating a third modification of the embodiment shown in FIG. 1.

FIG. 4 illustrates a third modification of the first embodiment shown in FIG. 1. As shown in FIG. 4, the resistor pattern 216 is arranged on the FPC fixed part 116b of the base frame side.

The second and third modifications shown in FIGS. 3 and 4 can achieve the same advantages as those of the first embodiment illustrated in FIG. 1.

(Embodiment with a Plurality of Heads)

Figure 5:
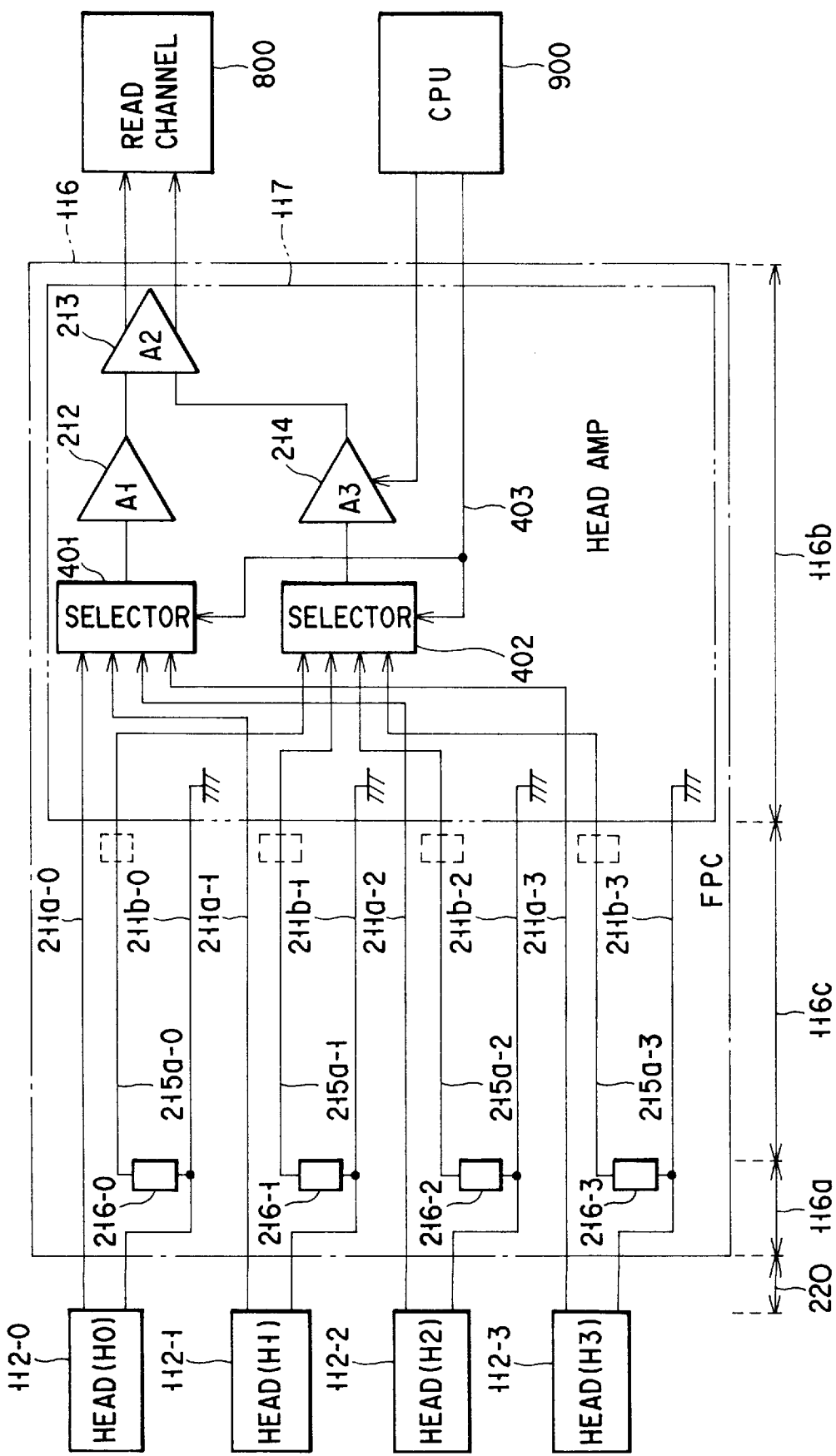
FIG. 5 is a block diagram showing another embodiment of the invention, which has a plurality of heads.

Most HDDs have the same number of plurality of heads as the number of the disks. FIG. 5 is a block diagram showing the second embodiment of the invention, which has a plurality of heads 112.

As shown in FIG. 5, the HDD according to the second embodiment has four heads is 112-0 (H0) to 112-3 (H3). Four the wiring patterns 112a-0, 112a-2, 112a-2 and 112a-3, and four wiring patterns 112b-0, 112b-1, 112b-2 and 112b-3 are provided on an FPC board 116. The wiring patterns 112a-0 to 112a-3 are connected to the heads 112-0 (H0) to 112-3 (H3), respectively. The wiring patterns 112b-0 to 112b-3 are connected to the heads 112-0 (H0) to 112-3 (H3), respectively. Four dummy wiring patterns 215a-0 to 215a-3 are provided on the FPC board 116 for the heads 112-0 to 112-3, extending parallel to the wiring patterns 211a-0 to 112a-3.

Four resistor patterns 216-0 to 216-3 are provided as resistor elements for the heads (MR heads) 112-0 (H0) to 112-3 (H3), respectively. The resistor patterns 216-0 to 216-3 are connected at one end to those ends of the dummy wiring patterns 215a-0 to 215a-3 which are located at a carriage-side movable part 116a . The resistor patterns 216-0 to 216-3 are connected at the other end to wiring patterns 211*b*-0 to 211*b*-3 in a carriage-side fixed part 116*a*. Thus, the wiring patterns 211*b*-0 to 211*b*-3 serve as patterns equivalent to the dummy wiring pattern 215*b* shown in FIG. 1, too. The resistor patterns 216-0 to 216-3 may be provided on those parts of the dummy wiring patterns 215*a*-0 to 215*a*-3 which are located near the head amplifier circuit 117.

The head amplifier circuit 117 of the second embodiment comprises three amplifiers 212 to 214 identical to those shown in FIG. 1 and two selectors 401 and 402. The selector 401 has four inputs which are connected to the wiring patterns 211*a*-0 to 211*a*-3 provided for the heads 112-0 (H0) to 112-3 (H3).

The selector 402 has four inputs which are connected to the dummy wiring patterns 215*a*-0 to 215*a*-3 provided for the heads 112-0 (H0) to 112-3 (H3).

The selectors 401 and 402 receive a head-selecting signal 403 from the CPU 900 mounted on a main PCB 119. In accordance with the head-selecting signal 403, the selector 401 outputs one of the four inputs to the amplifier 212 (A1), and the selector 402 outputs one of the four inputs to the amplifier 214 (A3). More precisely, when the selector 401 selects the wiring pattern 211*a*-i (i=0, 1, 2 or 3), thus selecting the head 112-0, 112-1, 112-2 or 112-3, the selector 402 selects the dummy wiring pattern 215-i which is arranged near the selected wiring pattern 211*a*-i. The outputs of the amplifiers 212 (A1) and 214 (A3) are supplied to the inputs of the differential amplifier 213 (A2). Hence, an external noise, if any, detected by the wiring pattern 211*a*-i and superposed on the read signal output by the head 112-i (Hi) can be canceled out by the noise detected by the dummy wiring pattern 215*a*-I by means of the differential amplifier 213 (A2).

The difference between the noise voltage on the wiring pattern 211*a*-i and the noise voltage on the dummy wiring pattern 215*a*-i may differ from head to head. Therefore, the most appropriate gain that the amplifier 214 must have for each head 112-i to cancel out the noise completely is predetermined for each head 112-I. The gain of the amplifier 214 must be changed to the predetermined value when the selector 401 selects one of the heads 112-0 to 112-3 in accordance with the head-selecting signal 403. Alternatively, four amplifiers, which are connected to the heads 112-0 to 112-3, respectively, and which have different gains most appropriate for the heads 112-0 to 112-3, respectively, may replace the amplifier 214. In this case, the output of each of these amplifiers is supplied to the amplifier 213 in accordance with the head-selecting signal 403.

As described above, the HDD shown in FIG. 5, i.e., the second embodiment, has a plurality of heads 112-0 (H0) to 112-3 (H3), wiring patterns provided on the FPC board 116 and connected to the heads, respectively, and dummy wiring patterns provided near the wiring patterns, respectively. This structure is ideal so long as noise cancellation is concerned, because the noise voltage on each wiring pattern is similar in waveform to the noise voltage on the associated dummy wiring pattern. However, the structure is not necessarily good for a small-sized HDD since as many dummy wiring patterns as the heads must be provided on the FPC board 116.

A modification of the second embodiment (FIG. 5), in which only one dummy wiring pattern is sufficient, irrespective of the number of the heads provided, will be described with reference to FIG. 6.

Figure 6:
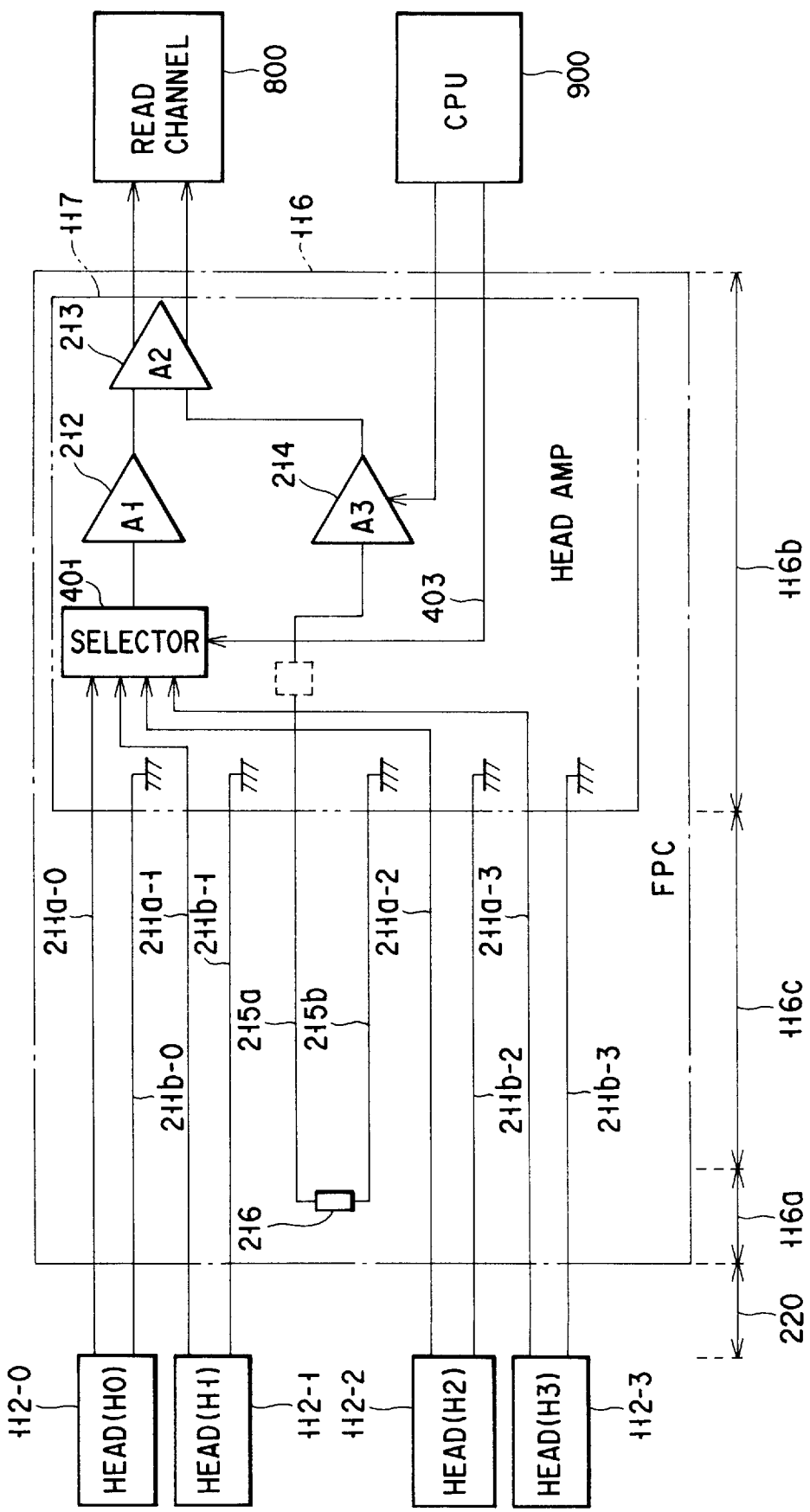
FIG. 6 is a block diagram depicting a modification of the embodiment shown in FIG. 5.

As shown in FIG. 6, a dummy wiring pattern is composed of two parts 215*a* and 215*b* which are provided in the movable part 116*c* of an FPC board 116. A resistor pattern 216 is provided for all heads 112-0 to 122-3. The resistor pattern 216 is connected to those ends of the parts 215*a* and 215*b* which are close to heads 112-0 to 112-3 and which are located in the carriage-side fixed part 116*a* of the FPC board 116. Wiring patterns 211*a*-0 to 211*a*-3 are provided on the FPC board 116 and connected at one end to the heads 112-0 to 112-3, respectively. Other wiring patterns 211*b*-0 to 211*b*-3 are provided on the FPC board 116 and connected at one end to the heads 112-0 to 112-3, respectively.

The parts 215*a* and 15*b* of the dummy wiring pattern are located at as similar distances as possible from the wiring patterns 211*a*-0 to 211*a*-3 and wiring patterns 211*b*-0 to 211*b*-3. More specifically, the part 215*a* is spaced apart from the center parts of the wiring patterns 211*a*-1 and 211*b*-1 by the same distance as the parts 215*b* is spaced apart from the center parts of the wiring patterns 211*a*-2 and 211*b*-2. (Namely, the parts 215*a* and 215*b* extend along a centerline of the movable part 116*c* of the FPC board 116.

The dummy wiring 215*a* is connected to the input of an amplifier 214 (A3) incorporated in a head amplifier circuit 117, in the base-side fixed part 116*b* of the FPC board 116. The resistor pattern 216 may be located near the input terminal of the amplifier 214 (A4) as is indicated by broken lines in FIG. 6.

Since the parts 215*a* and 215*b* of the dummy wiring pattern are arranged along the centerline of the FPC board 116, the part 215*a* detects noises similar to the noises detected by the wiring patterns 211*a*-0 to 211*a*-3. Hence, the noise contained in the read signal can be canceled by the noises detected by the part 215*a* of the dummy wiring line, no matter which head (head 112-0, 112-1, 112-2 or 112-3) has been selected by the selector 401 incorporated in the head amplifier circuit 117.

As has been described in detail, any HDD according to the present invention has at least one dummy wiring pattern arranged near the wiring pattern which guides a read signal from the head to the head amplifier circuit. Thus, the dummy wiring pattern detects an external noise, if any superposed on the read signal, detected by the wiring pattern. The differential amplifier provided in the head amplifier circuit cancels out the external noise with the noise detected by the dummy wiring pattern.

According to the present invention, the noise on the wiring pattern provided on the FPC board is detected by the dummy wiring line, without using an auxiliary element provided on the head body (i.e., slider). The head amplifier circuit removes the noise from the read signal generated by the head. Containing no noise, the read signal has high quality. The high-quality read signal is supplied to the read channel. The read channel cain therefore accomplish data reproduction in which read error is inhibited.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A disk storage drive having a disk used as a storage medium and a head provided for reading data from the disk, said drive comprising:

first amplifier means for amplifying a read signal read by the head from the disk;

cable means connecting the head and the first amplifier means, for supplying the read signal from the head to the first amplifier means;

dummy circuit means provided near the cable means, for detecting noise on the cable means and supplying the noise as a noise signal;

second amplifier means connected to the dummy circuit means, for amplifying the noise signal supplied from the dummy circuit means; and noise canceling means for receiving the read signal from the first amplifier means and the noise signal from the second amplifier means, and removing the noise corresponding to the noise signal from the read signal.

2. The drive according to claim 1, wherein the dummy circuit means has a wiring pattern including a resistor element.

3. The drive according to claim 1, wherein the dummy circuit means has dummy head means including a resistor element equivalent to a resistor element of the head.

4. The drive according to claim 1, wherein the noise canceling means has differential amplifier means for outputting a read signal which is a difference between an output of the first amplifier means and an output of the second amplifier means.

5. The drive according to claim 1, wherein the first amplifier means and said second amplifier means have the same gain.

6. A disk storage drive having a disk used as a storage medium and a head provided for reading data from the disk, said drive comprising:

first amplifier means for amplifying a read signal read by the head from the disk;

a flexible printed circuit board holding the first amplifier means and having a wiring pattern connecting the head to the first amplifier means, for supplying the read signal from the head to the first amplifier means;

dummy circuit means provided on the flexible printed circuit board and located near the wiring pattern, for detecting noise on the wiring pattern and supplying the noise as a noise signal;

second amplifier means provided on the flexible printed circuit board and connected to the dummy circuit means, for amplifying the noise signal generated by the dummy circuit means; and noise canceling means provided on the flexible printed circuit board, for receiving the read signal from the first amplifier means and the noise signal from the second amplifier means, and removing the noise corresponding to the noise signal from the read signal.

7. The drive according to claim 6, wherein the dummy circuit means has a wiring pattern including a resistor element.

8. The drive according to claim 6, wherein the head is an magnetoresistive (MR) head, and the dummy circuit means is a dummy wiring pattern including a resistor element which has substantially the same resistance as the head.

9. The drive according to claim 6, wherein the noise canceling means has differential amplifier means for outputting a read signal which is identical to a difference between an output of the first amplifier means and an output of the second amplifier means.

10. The drive according to claim 6, wherein the second amplifier means has a variable gain, and gain setting means is provided for changing the gain of the second amplifier means to a value substantially equal to the gain of the first amplifier means.

11. A disk storage drive having a disk used as a storage medium and a plurality of heads provided for reading data from the disk, said drive comprising:

first selector means for selecting one of read signals read from the disk by the heads;

first amplifier means for amplifying the read signal selected by the first selector means;

a flexible printed circuit board having wiring patterns provided for the heads, respectively, for supplying the read signals from the heads to the first selector means;

dummy circuit means provided on the flexible printed circuit board, located near the wiring patterns, and having dummy wiring patterns for detecting noises on the wiring patterns and supplying the noises as noise signals;

second selector means connected to the dummy wiring patterns, for selecting one of the noise signals supplied from the dummy wiring patterns;

second amplifier means for amplifying the noise signal selected by the second selector means; and third amplifier means for removing the noise corresponding to the noise signal from the read signal, said third amplifier means comprising a differential amplifier circuit for outputting a difference between an output of the first amplifier means and an output of the second amplifier means.

12. The device according to claim 11, wherein the first amplifier means and the second amplifier means select one noise signal in accordance with a head-selecting signal supplied from a CPU for controlling the drive.

13. The drive according to claim 11, wherein the dummy circuit means has one dummy wiring pattern provided on the flexible printed circuit board and located at as similar distances as possible from the wiring patterns, for detecting noises on the wiring patterns and supplying the noises as noise signals.

14. The drive according to claim 11, further comprising gain setting means for setting gains for the heads, in the second amplifier.

15. A method of amplifying a read signal read from a disk by the head incorporated in a disk storage drive, said method comprising the steps of:

detecting a noise signal superposed on the read signal, by a dummy wiring pattern provided between the head and a first amplifier for amplifying the read signal and located near a wiring pattern for supplying the read signal;

amplifying the noise signal supplying by the dummy wiring pattern, by means of a second amplifier;

removing the noise signal from the read signal by a third amplifier which finds a difference between an output of the first amplifier and an output of the second amplifier; and supplying the read signal front the third amplifier to a signal-processing circuit.

* * * * *